United States Patent [19]
Arita et al.

[11] Patent Number: 5,586,713
[45] Date of Patent: Dec. 24, 1996

[54] METHOD FOR WIRE BONDING

[75] Inventors: Kiyoshi Arita; Kouichi Takahashi, both of Fukuma-machi, Japan

[73] Assignee: Matsushita Electric Industrial Co., Ltd., Kadoma, Japan

[21] Appl. No.: 298,148

[22] Filed: Aug. 30, 1994

[30] Foreign Application Priority Data

Aug. 31, 1993 [JP] Japan .................................. 5-215518
Feb. 9, 1994 [JP] Japan .................................. 6-015179

[51] Int. Cl.⁶ .......................... B23K 20/10; B23K 31/02
[52] U.S. Cl. .................. 228/102; 228/110.1; 228/180.5
[58] Field of Search ........................ 228/102, 110.1, 228/180.5

[56] References Cited

U.S. PATENT DOCUMENTS

| | | | |
|---|---|---|---|
| 4,444,349 | 4/1984 | Bilane et al. | 228/102 |
| 4,789,095 | 12/1988 | Kobayashi | 228/102 |
| 5,024,367 | 6/1991 | Terakado et al. | 228/180.5 |
| 5,078,312 | 1/1992 | Ohashi et al. | 228/102 |
| 5,115,960 | 5/1992 | Shimizu | 228/102 |
| 5,443,200 | 8/1995 | Arikado | 228/102 |

*Primary Examiner*—P. Austin Bradley
*Assistant Examiner*—Jeffrey T. Knapp
*Attorney, Agent, or Firm*—Ratner & Prestia

[57] ABSTRACT

A wire bonding method includes the steps of a lowering a capillary tool supplying a wire, restraining the lowering of the capillary tool, and wire bonding the wire to a bonding face. The inertial force of the capillary tool is reduced to almost zero by restraining the lowering of the capillary tool. As a result, wire bonding is performed under proper bonding force since no bonding force is applied to a ball on the tip of wire from the inertial force of the capillary tool. The bonding force is provided using torque control from an electric motor which lowers the capillary tool.

5 Claims, 12 Drawing Sheets

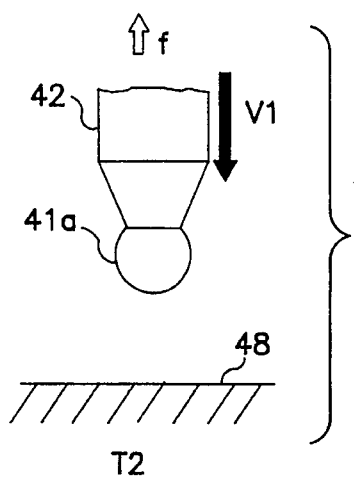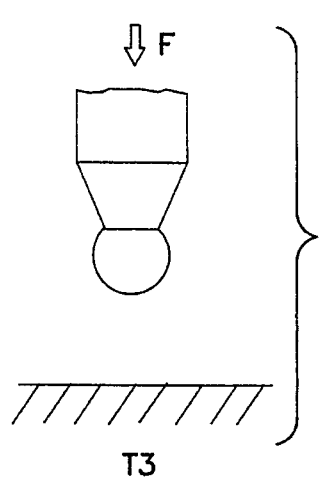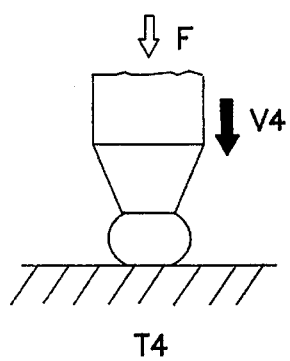
FIG. 14(a)  FIG. 14(b)  FIG. 14(c)
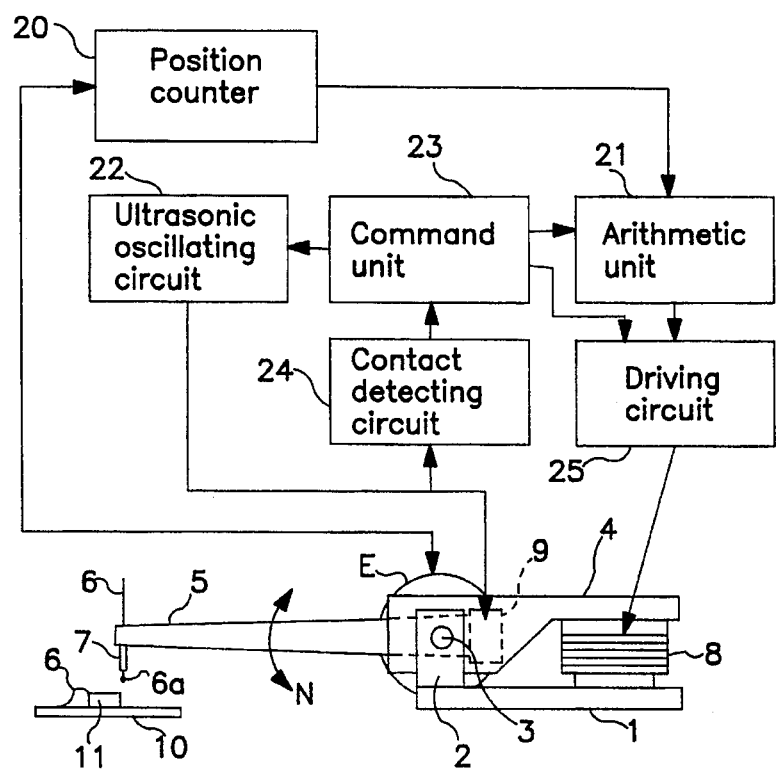
FIG. 15
PRIOR ART upward swing

A

B

Z downward swing

A

B

Z

METHOD FOR WIRE BONDING

BACKGROUND OF THE INVENTION

1. Field of the Invention

The present invention relates to a wire bonding apparatus for electrically connecting a semiconductor chip (hereinafter called "chip") to a substrate with metal wires which are widely used in manufacturing processes of electronic components. Particularly, the invention relates to a wire bonding method and apparatus which prevent the chip from being damaged and which complete wire bonding in a relatively shorter period of time.

2. Description of the Prior Art

FIG. 15 shows the structure of the conventional wire bonding apparatus which includes a bearing 2 fixed on a frame 1 which supports shaft 3 of swing unit 4. A bonding arm 5 is fixed on swing unit 4 which swings along the arrow mark N. Also provided is a capillary tool 7 which is held on the tip of the bonding arm 5. A wire 6 passes through the capillary tool 7 and has on its tip a ball 6a formed by an electric spark. A voice coil motor 8 drives the bonding arm 5 and a ultrasonic vibrator 9 transmits an ultrasonic vibration to the bonding arm 5 which also functions as a horn transmitting the ultrasonic vibration. A chip 11 to be wire bonded is mounted on substrate 10. Also provided is an encoder E which detects the rotational volume of the shaft 3 and outputs pulse which are cumulatively counted by positioning counter 20. The cumulative value represents the present position of the capillary tool 7 as a pulse volume from the encoder. The present position of the capillary tool 7 is transmitted to an arithmetic unit 21. Also included is a command unit 23 which instructs the ultrasonic oscillating circuit 22 to power the ultrasonic vibrator 9 for ultrasonic vibrating.

The contact detecting circuit 24 detects contact between the ball 6a and the bonding face of the chip by observing the impedance of bonding arm 5 to the vibration. When the ball 6a is off the bonding face of the chip, the impedance of the bonding arm 5 is low since the arm can vibrate freely. However, when the bonding arm 5 contacts the bonding face, the impedance of the bonding arm 5 increases sharply since the vibration of the bonding arm is restrained. In response to the sharply increased impedance, the contact detecting circuit 24 outputs a contact detecting signal to the command unit 23.

When performing the wire bonding, the command unit 23 provides a positioning command to the arithmetic unit 21 instructing the target position for the capillary tool. The target position is where the ball 6a is to contact the bonding face of the chip. The arithmetic unit 21 provides the difference between the present position and the target position to driving circuit 25 and the driving circuit 25 supplies the driving current to the voice coil motor 8 corresponding to the difference between the positions. The voice coil motor 8 raises or lowers the bonding arm 5 so that the position difference becomes zero. Ball 6a contacts the bonding face of the chip and, as a result, the impedance of the bonding arm 5 changes. In response, a contact detecting signal is output. When the contact detecting signal is received by the command unit 23, the command unit 23 changes the command signal to a torque command from a positioning command. Driving circuit 25 supplies an electric current to the voice coil 8 to generate the torque command.

FIG. 16 shows the timing chart of the conventional wire bonding.

From Time T1 to T2, the capillary tool lowers from its initial position to a search level at a high speed of V1. The location of the search level is 200 μm to 300 μm above the chip surface.

From T2 to T3, the ultrasonic vibrator 9 generates a soft vibration to detect contact. The capillary tool 7 lowers from the search level to the surface of chip at a low speed of V2.

At Time T3, capillary tool 7 reaches the surface of the chip.

From Time T3 to T4, (ΔT), the capillary tool 7 lowers at a speed of V3 which is lower than V2, crushing the ball 6a on the tip of wire.

At Time T4, the contact detecting circuit 24 provides a contact detecting signal.

Then from Time T4 to T5, the command unit 23 supplies a torque command to the driving circuit 25. The driving circuit 25 supplies the electric current to voice coil motor 8 so that the proper bonding force F, the pressure added on the ball when bonding, can be generated. In addition, the ultrasonic vibrator 9 generates a strong vibration for the bonding.

At Time T5, bonding is completed and the capillary tool returns to the initial position.

FIG. 17 shows the ball 6a on the tip of a wire at times T3, T4, and T5 in FIG. 16. At time T3, the capillary tool reaches the bonding face of chip. At time T4, the capillary tool lowers at a speed of V3 by crushing the ball 6a on the tip of wire at which time the voice coil motor 8 is supplied electric current to generate the proper bonding force F. An excessive load, the bonding force F from the voice coil motor 8 plus inertial force derived from the movable portion, however, is applied instantaneously causing ball 6a to be greatly distorted and which may result in defective bonding or damaged to the chip.

Recently, bonding intervals between bonds have become made smaller because of the use of higher density integrated circuits. As a result, distortion of ball 6a may cause a short with an adjacent bonding point. In addition, chips fabricated from GaAs which are widely used, may be more likely to be damaged because GaAs has weak mechanical strength. Thus, excessive force may cause damage to the chip. Accordingly, excessive bonding load is undesirable. On the other hand, shortening the cycle time to complete the bonding steps is desirable.

SUMMARY OF THE INVENTION

The present invention relates to a wire bonding method including the steps of:

(a) lowering a capillary tool which supples wires,
(b) applying a restraint to the lowering of the capillary tool, and
(c) performing wire bonding.

According to the present invention the inertial force of the lowering capillary tool is reduced to almost zero at step (b). As a result, wire bonding is performed under proper bonding force since bonding force is not applied to the ball as a result of the inertial force of the moving portion of the capillary tool. The bonding load is only provided through torque control of the electric motor.

The lowering of the capillary tool is restrained by the electric motor which drives the bonding arm which applies torque in a direction to raise the capillary tool. As discussed later, torque is generated by clearing the residual pulses to zero in the positioning control driver.

BRIEF DESCRIPTION OF THE DRAWINGS

FIGS. 14a–14c show states of the ball on the tip of wire at times T2, T3 and T4 shown in FIG. 13.

FIG. 15 is the block diagram illustrating the structure of a conventional apparatus for wire bonding.

EXEMPLARY EMBODIMENT

Figure 1:
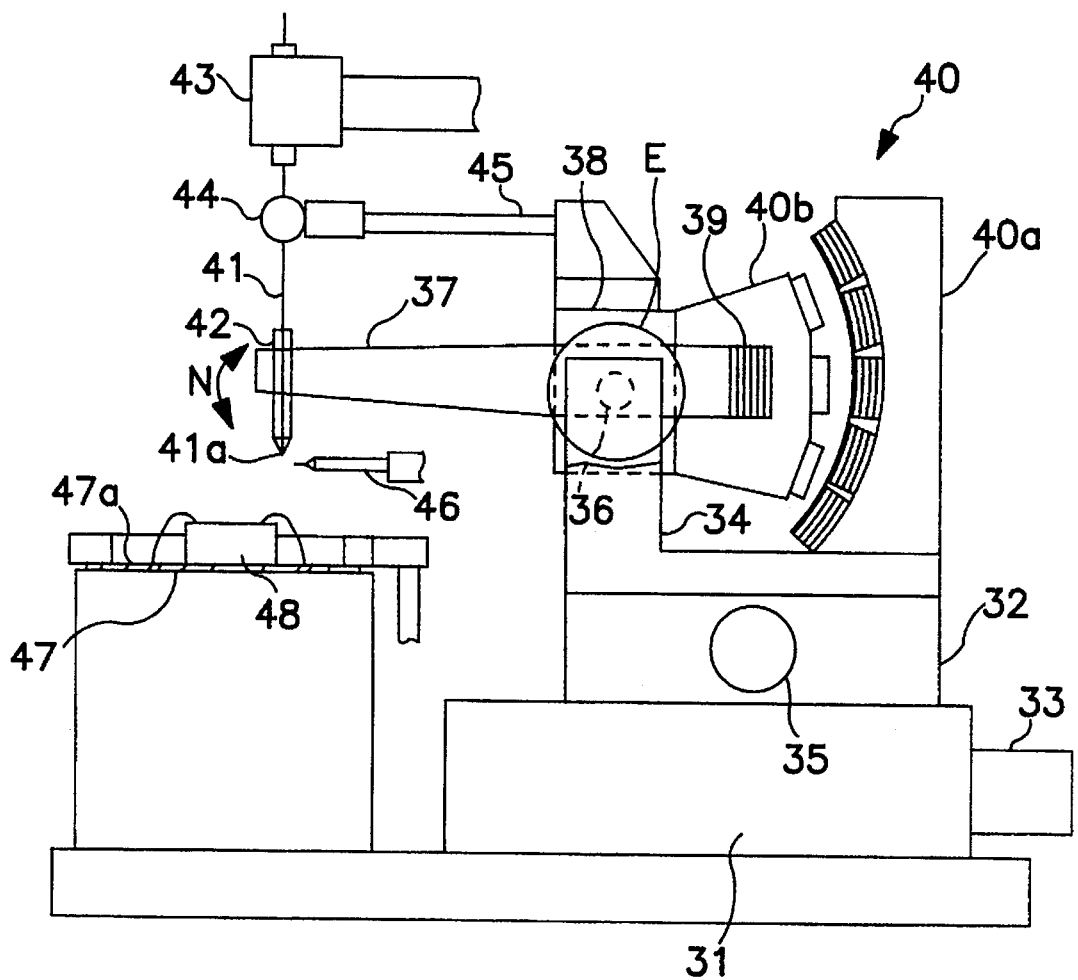
FIG. 1 is a structural diagram of a wire bonding apparatus according to an exemplary embodiment of the invention.

FIG. 1 illustrates the structure of the exemplary wire bonding apparatus. Included is a X table 32 which is placed on a Y table 31. Y motor 33 drives Y table 31. A supporting block 34 is mounted on X table 32 so that the supporting block can slide freely along the X direction. A X motor 35 is provided for moving supporting block 34. A bonding arm 37 supported by a support block 34 via box 38 and shaft 36 is also provided. The bonding arm 37 can rise and lower along the N direction freely. The encoder E detects the swing angle of the bonding arm 37. An ultrasonic vibrator 39 mounted on the bonding arm 37 is also provided since the bonding arm 37 also functions as a horn for transmitting ultrasonic vibration. Also provided is an electric motor 40 having stator 40a and rotor 40b which swings bonding arm 37. Also included is wire 41 which passes through the capillary tool 42 and tension clamp 43 which applies tension to the wire. A cut clamp 44 supported by the arm 45 is also provided for clamping the wire 41. A torch electrode 46 supported by a supporter (not shown in FIG. 1) forms a ball 41a on the tip of wire 41 using an electric spark. A chip 48 is mounted on the substrate 47 having an inner-lead surface 47a. The substrate can be, for example, a lead frame.

Figure 2:
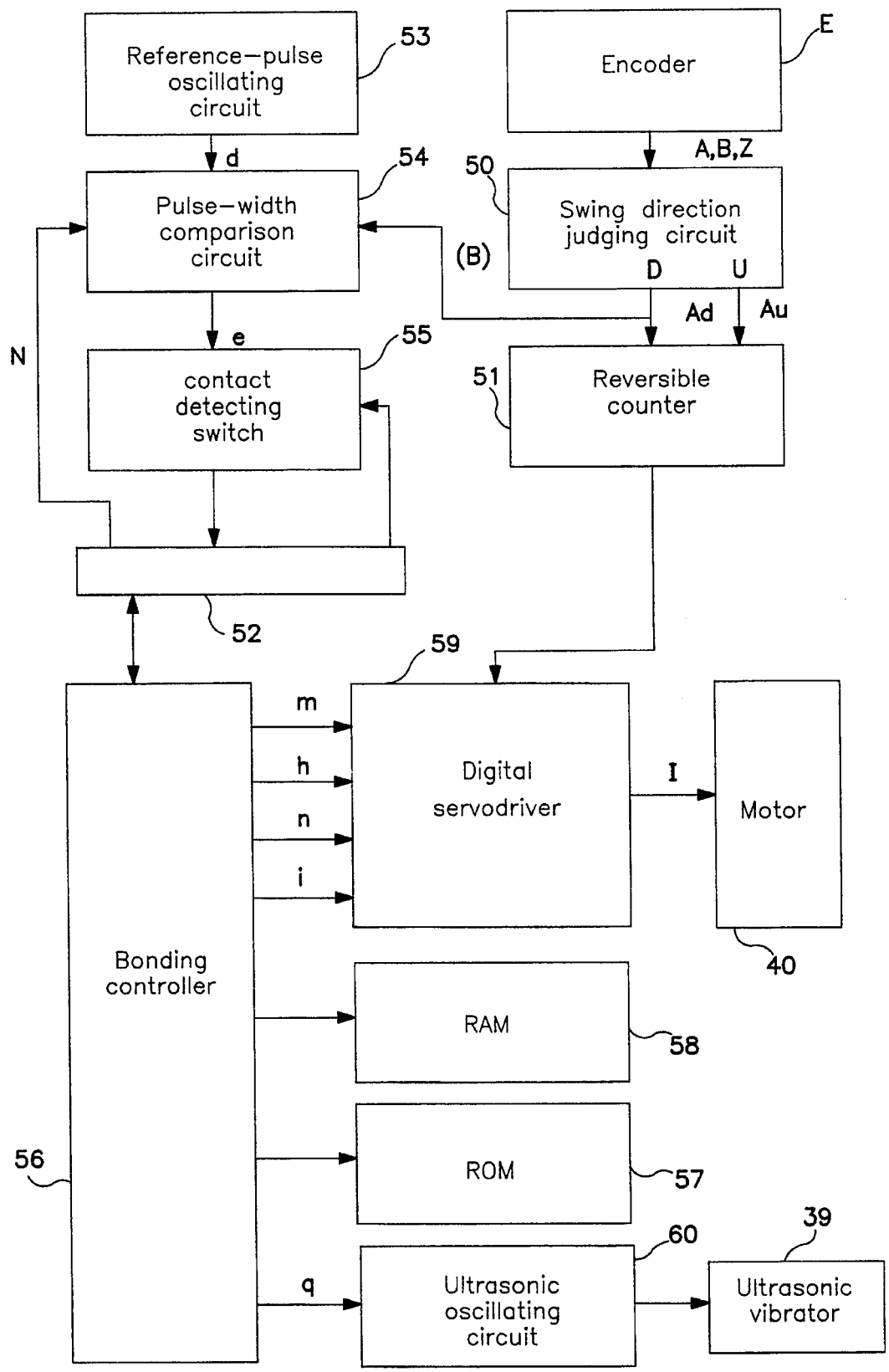
FIG. 2 is the block diagram of a control system of the exemplary wire bonding apparatus.
Figure 18:
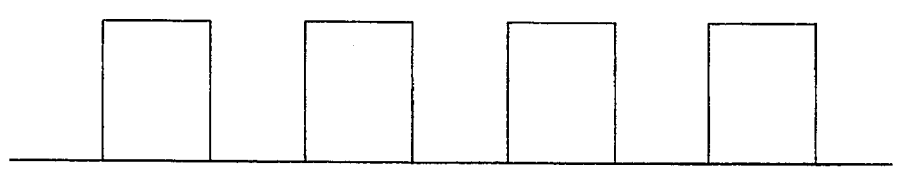
FIG. 18 is a timing diagram illustrating the operation of the exemplary wire bonding apparatus.
Figure 18:
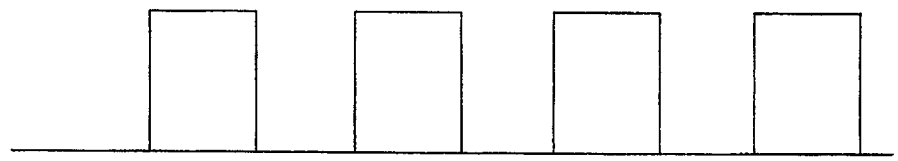
Figure 18:
Figure 18:
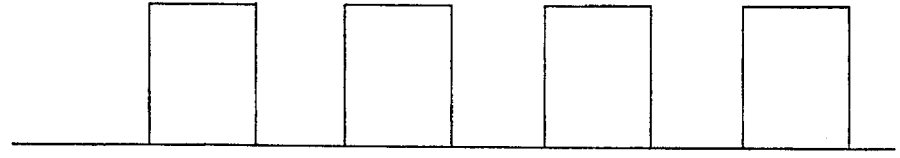
Figure 18:
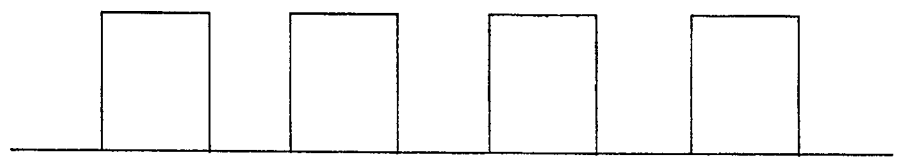
Figure 18:

FIG. 2 is the block diagram of the control system of the wire bonding apparatus. The control system includes an encoder which generates pulse signals A, B and Z. The encoder generates, for example, 1000 pulses for each pulse signal A and B, and 1 pulse for pulse signal Z at ever rotation. As shown in FIG. 18, the phase difference between pulse signal A and pulse signal B is determined by the swing direction of bonding arm 37. The phase of pulse signal A preceeds pulse signal B when the bonding arm swings upward and the phase of pulse signal B preceeds pulse signal A when the bonding arm swings downward. A swing direction judging circuit 50 judges the swing direction of the bonding arm by detecting the phase difference between pulse signals A and B. Based on the judgement, the swing direction judging circuit supplies the pulse signal of the encoder, for example, pulse signal A, to reversible counter 51 as pulse signal Au through terminal D when the bonding arm swings downward. Alternatively, the swing direction judging circuit provides pulse signal A, for example, pulse signal Au through a terminal U when the bonding arm swings upward. Reversible counter 51 adds pulse signal Ad and deducts pulse signal Au and provides a cumulative value to digital servodriver 59. The cumulative value, hereinafter called encoder feedback signal j, represents the present position of the bonding arm, and also represents the present position of the capillary tool 42 using the pulse signal volume of the encoder. At the beginning of the bonding process, the bonding arm and the capillary tool 42 are set at an origin position and reversible counter 51 is initialized to zero. For example, if the bonding arm swings downward for an angle of 300 pulses and then swings upward for an angle of 120 pulses as indicated by the encoder pulse signal, the reversible counter 51 subtracts pulse signal Au from pulse signal Ad, (Ad-Au), or 300−120 to calculate 180 pulses. The 180 pulses represent the angular distance between the present position and the origin position of the capillary tool 42 using the pulse signal volume of the encoder.

Figure 10:
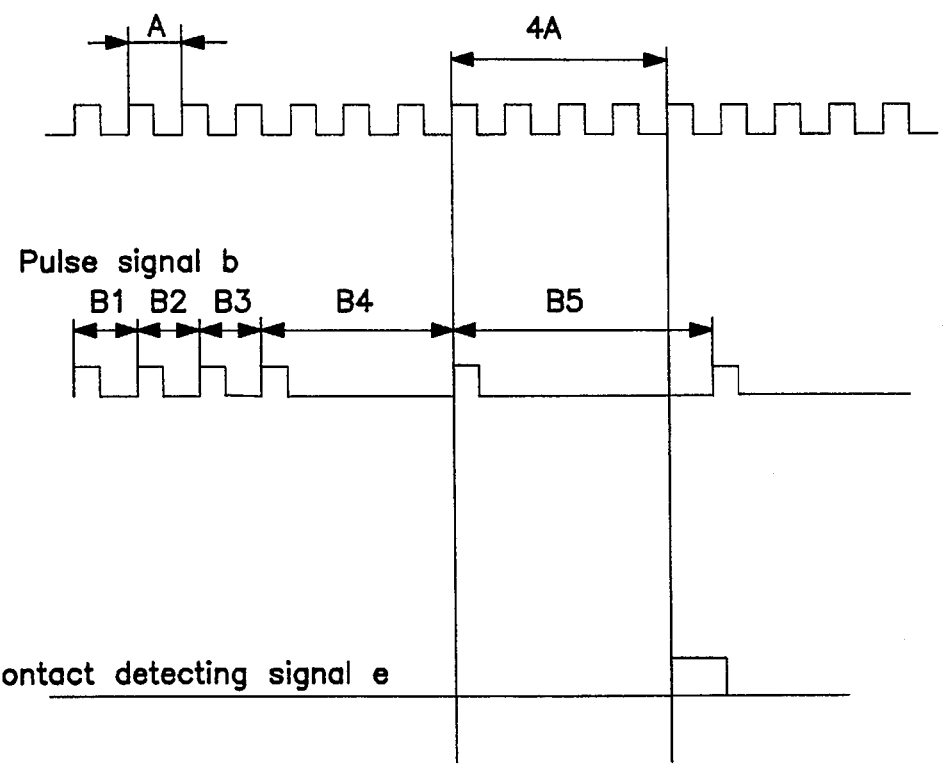
FIG. 10 is a timing diagram illustrating contact detection.

Also provided is a pulse-width comparison circuit 54 and a contact detecting switch 55 which form the contact detecting means. The pulse-width comparison circuit compares the cycle time of the downward pulse-signal (B) which represents the lowering speed of the capillary tool 42 to the cycle time of the reference-pulse-signal d generated by the reference-pulse oscillating circuit 53. As shown in FIG. 10, the cycle times B1, B2 and B3 of downward-pulse-signal (B) are almost constant, which means that the capillary tool lowers at a constant speed. The speed of the capillary tool slows at cycle B4. Then, at cycle B5, the capillary tool nearly stops, which means the ball 41a starts to contact to the bonding face of the chip. After four cycle times of reference pulses are produced in a cycle time B, that is where a specified threshold value is four or N=4, the pulse-width comparison circuit 54 outputs a contact detecting signal e to a contact detecting switch 55. Contact detecting switch 55 outputs the contact detecting signal e to the interface 52 only when a permitting signal g is provided to the contact detecting switch 55. Also included is a control unit 56 and a ROM 57 and RAM 58. The control unit 56 controls the digital servo driver 59 and the ultrasonic oscillating circuit 60.

Figure 5A:
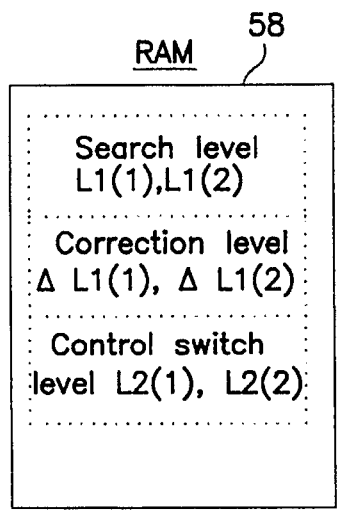
FIGS. 5a and 5b illustrate the contents of the Read Only Memory (ROM) and Random Access Memory (RAM) shown in FIG. 2.
Figure 5B:
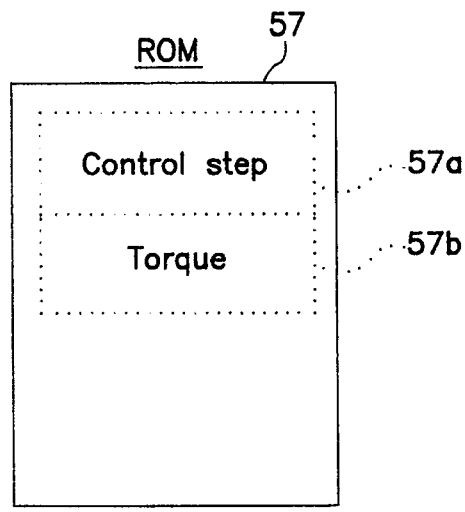

As shown in FIGS. 5a and 5b, ROM 57 includes memory area 57a which stores control steps and operation patterns, both are explained later, and memory area 57b which is used to store the torque value corresponding to bonding force F. RAM 58 stores the height level values of L1, L2 and L3 shown in FIG. 9 where L1 is 200–300 μm above the bonding surface.

When detecting a contact, the lowering speed of the capillary tool is changed to V2, low speed, from V1, high speed, at a height of L1. The lowering control for capillary tool is changed to torque control from positioning control at a height of L2. When bonding is completed, the capillary tool is at a height of L3. L3 is the height of the bonding face of the chip where L2=L3+ΔL. This equation is explained later.

The data RAM 58 shown in FIG. 5 stores L1(1), the height of L1 when bonding is performed on the bonding face of chip; and L1(2), the height of L1 when bonding is performed on the lead-frame. Also stored is L2(1), the height of L2 when bonding is performed on the bonding face of chip; and L2(2), the height of L2 when bonding is performed on the lead-frame.

Figure 3:
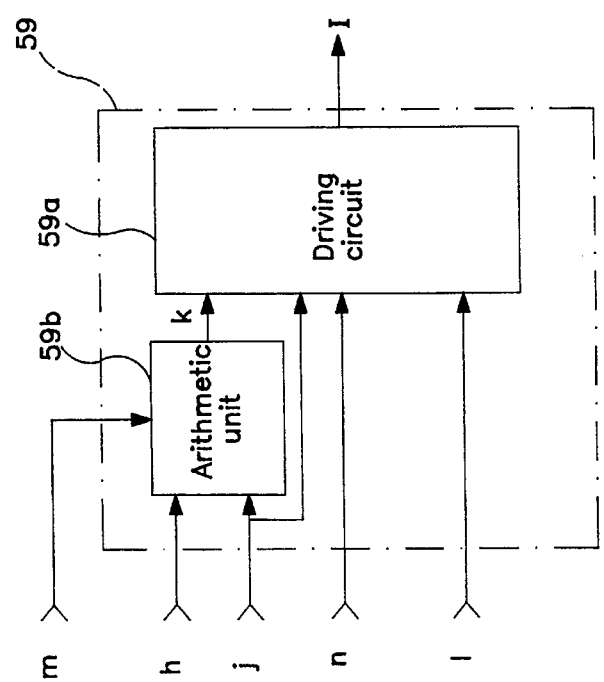
FIG. 3 is the block diagram of a digital servo driver of the exemplary wiring bonding apparatus.

FIG. 3 is the block diagram showing the digital servo driver 59 which includes driving circuit 59a and arithmetic unit 59b. Driving circuit 59a provides a driving current I to the electric motor 40. In operation, arithmetic unit 59b receives several signals including a positioning command h which instructs the target position of the capillary tool 42 using the pulse signal volume of the encoder, feedback signal j from the reversible counter 51, and residual-pulse clearing signal m. The arithmetic unit 59b provides the residual-pulse signal k which is the difference between the positioning command h and feedback signal j (k=h−1) to driving circuit 59a. The residual pulse k corresponds to the distance between the present and target positions of the capillary tool. In other words, the k pulse is generated during this distance. The residual pulse is set to zero when the target position is reached. The residual pulse is cleared to zero when the arithmetic unit 59b receives the residual-pulse clearing signal m.

Figure 4:
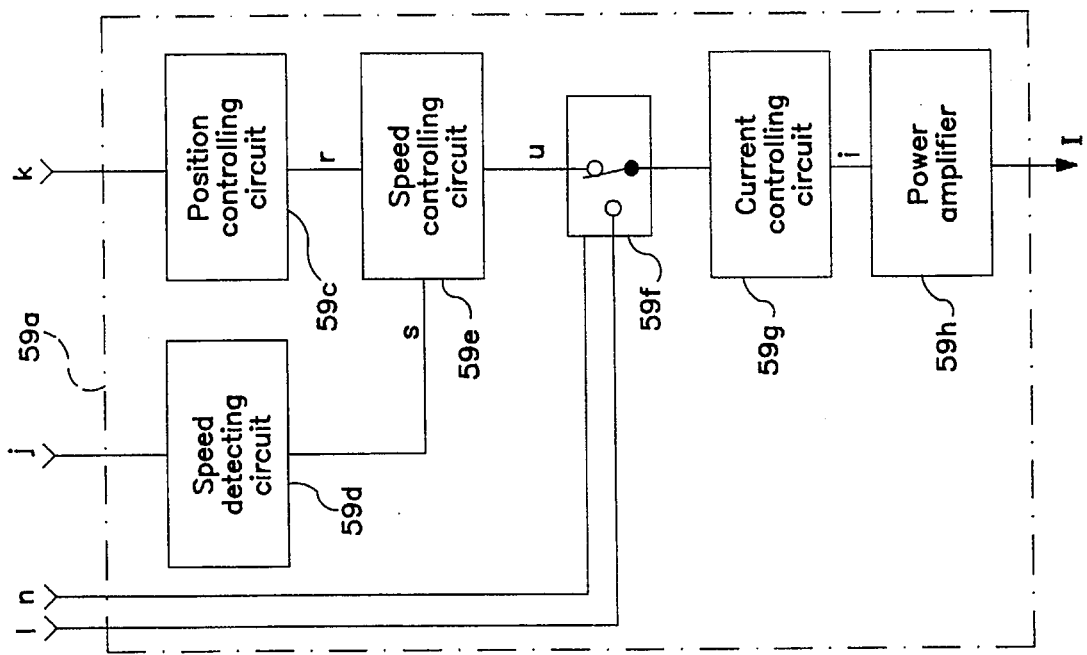
FIG. 4 is the block diagram of a driving circuit in the digital servo driver.

The driving circuit 59a selects either the positioning control driver or the torque control driver. FIG. 4 illustrates the structure of driving circuit 59a. The positioning control circuit 59c receives the residual-pulse signal k and then supplies speed command r to speed control circuit 59e. Also included is speed detecting circuit 59d which receives feedback-pulse-signal j and supplies a speed-feedback-signal s. Speed control circuit 59a in response to the speed-signal r and speed-feedback-signal s outputs current command u to switch 59f which selects either one of two functions of driving-circuit 59a in response to control switch signal n. When switch 59f selects the current command signal u, the driving circuit 59a functions as a positioning control driver. In this case, the motor rotates in a direction to decrease the residual pulse to zero. That is, the positioning control causes the motor to rotate toward a designated positioning. When the switch selects the torque command signal 1, circuit 59a functions as a torque control driver. In this case, the motor rotates generating torque 1 until instructed otherwise by the torque control driver. The motor generates torque regardless of the residual pulses.

The current control circuit 59g outputs current i corresponding to the current command signal u or torque command signal 1 depending on switch 59f. The current i is amplified by power amplifier 59h producing motor current I.

Figure 6:
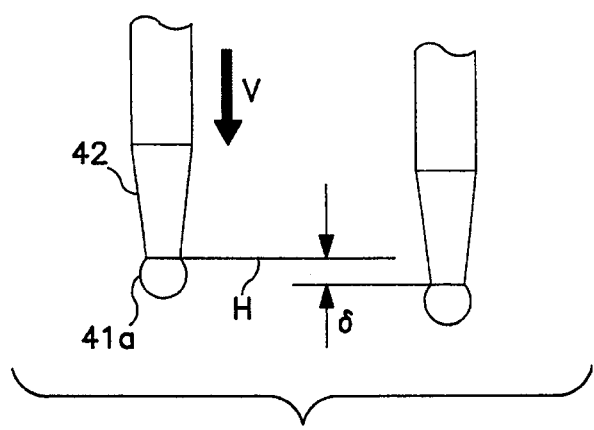
FIG. 6 illustrates the restraint applied against the lowering of the capillary tool.

FIG. 6 describes the restraint applied against the lowering of capillary tool when the driving circuit 59a selects the positioning control.

A shown in FIG. 6, capillary tool 42 is moving downward at speed V. When the capillary tool reaches level H, a residual pulse clearing signal m is supplied to arithmetic unit 59b so that the residual pulse is cleared to zero. At the same time, the positioning command h is provided by bonding controller 56. As a result, the current target position is cancelled and level H becomes the new target position. This occurs because the residual pulse is zero at level H. The capillary tool will then stop at level H, the new target position, when lowering. Since the capillary tool possesses inertial force, however, the capillary tool does not stop at level H, but travels beyond level H. Residual pulses are generated in arithmetic unit 59b by the capillary tool travelling beyond level H. The electric motor 40 generates upward torque to decrease the residual pulse to zero, thus, restraining the inertial force of the lowering capillary tool. The inertial force is cancelled to zero by the torque and the lowering speed becomes zero after the capillary tool has traveled a distance of δ. Then the capillary tool moves upward to the level H if not instructed otherwise. The distance δ is made smaller by the restraining force which is generated when the residual pulse is cleared in the positioning control driver. The restraining force is utilized in the present invention to prevent excessive bonding force caused by the inertial force of the capillary tool.

Figure 7:
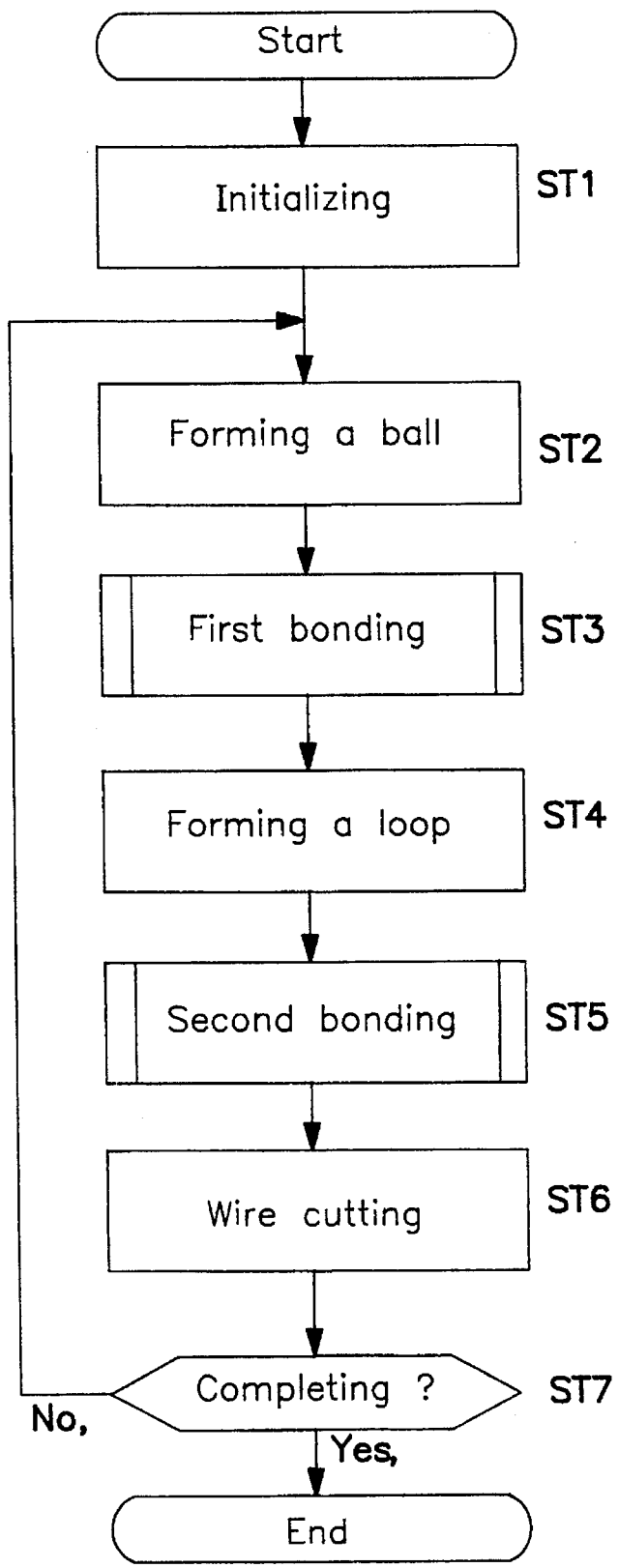
FIG. 7 is a flow chart diagram illustrating a bonding operation.

FIG. 7 is a flow chart diagram illustrating wire bonding according to the exemplary embodiment of the invention. First at step ST1, reversible counter 51 is initialized to threshold value N in the pulse-width comparison circuit 54.

Then, at step ST2, the tip of the wire is sparked with the torch electrode to form ball 41a on the tip of wire.

At step ST3, the ball 41a is bonded onto the bonding face of the chip 48 which is the first bonding operation.

Then at step ST4, capillary tool 42 is moved along a specified locus to a position above the inner lead area 47a of the lead frame where loops are formed with the wires.

At step ST5, the tip of the loop is bonded to the inner lead 47a which is the second bonding operation.

Then, at step ST6, the wire is cut from the second bonded portion.

Finally, at step ST7, steps ST1 through ST6 are repeated until all bondings are completed.

Figure 8:
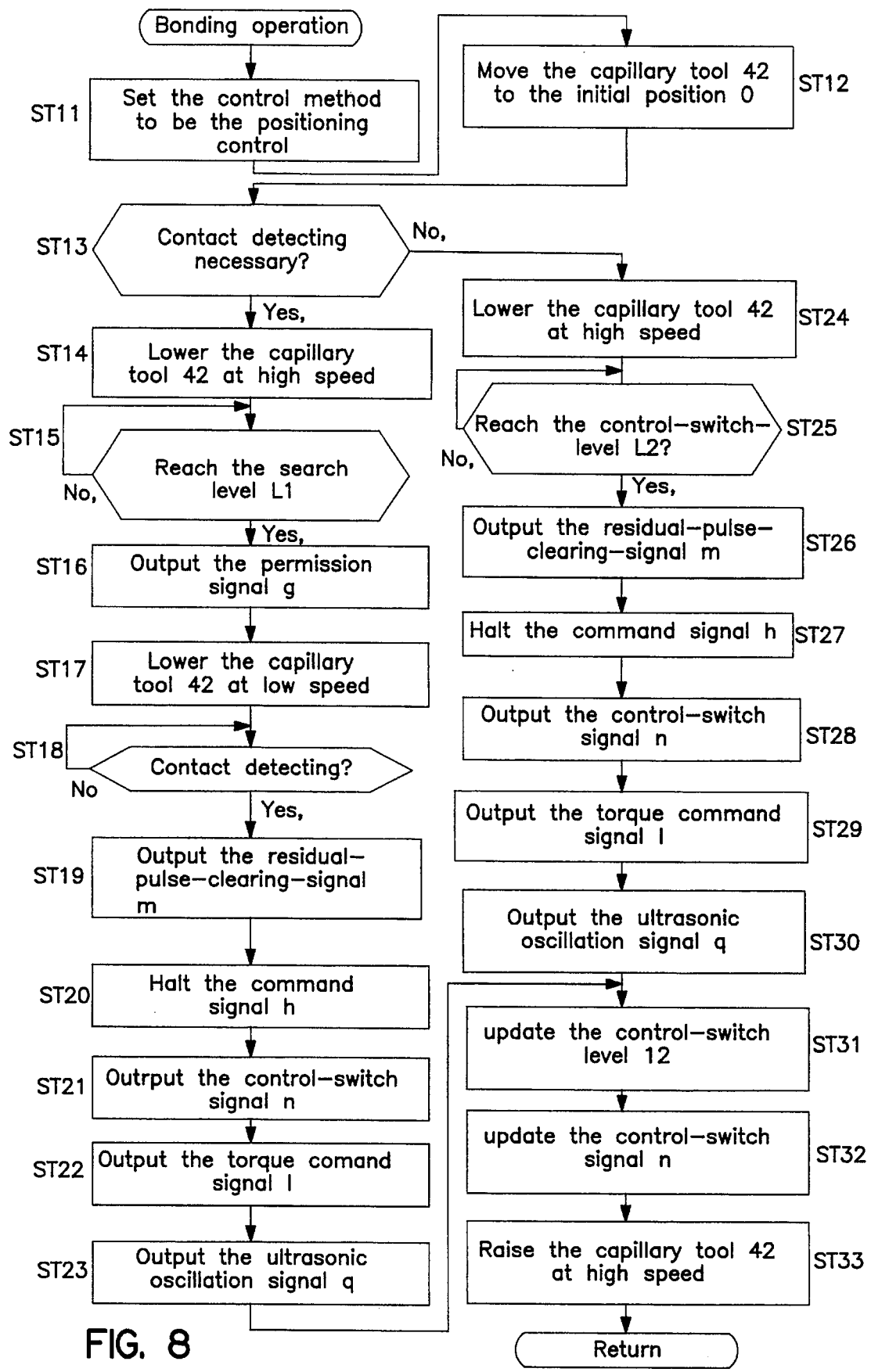
FIG. 8 is a flow chart diagram illustrating the bonding operation in greater detail.

FIG. 8 is a flow chart diagram illustrating step ST3 in greater detail. Since the first bonding operation is similar to the second bonding operation, a detail explanation of the second bonding operation is omitted.

At step ST11 the control method is set to be the positioning control method.

Then, at step ST12, capillary tool 42 is moved to initial position 0.

Then at step ST13, it is determined whether it is necessary to detect the contact between ball 41a on the tip of wire and the chip.

The individual height of the bonding face of each chip is unknown for the initial bonding to each chip. Accordingly, bonding step A, steps ST14 to ST23, which includes contact detection between the ball 41a and bonding face is selected. For subsequent bondings, the second wire bonding and so on, bonding step B, steps ST24 to ST30, which does not include contact detection is selected since the height of the bonding face is known. Bonding step B is faster than that of step A because step B does not include contact detection. Steps ST14 through 23 are explained below with reference to the timing diagram shown in FIG. 11 and are selected for the initial bonding to a new chip.

Figure 11:
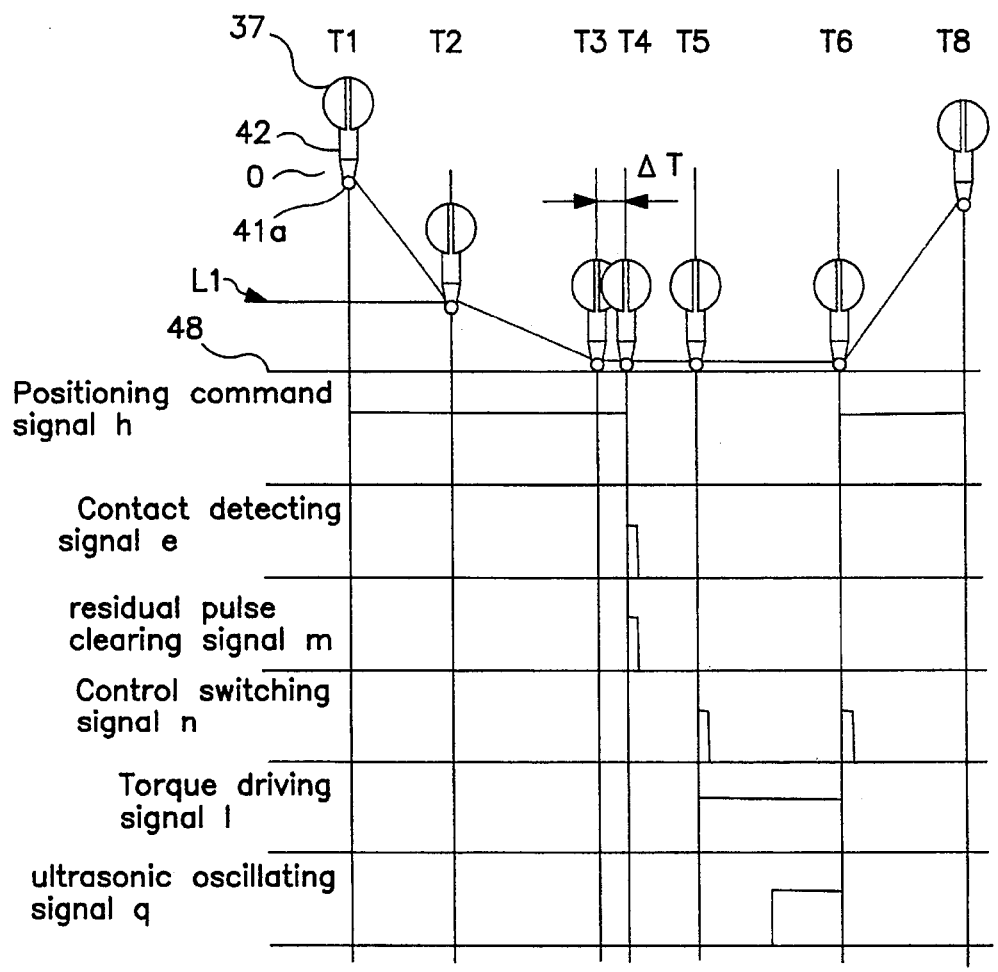
FIG. 11 is a timing diagram illustrating the initial bonding of a wire to a chip.

Since this is the first bonding to a new chip, bonding step A is selected. As shown in FIG. 11, at step ST15, the capillary tool lowers from the initial position 0 to the specified search level L1 at high speed.

Then at step ST15, and time T2, capillary tool 42 reaches search level L1.

At step ST16, and time T2, contact detecting switch 55 receives the permission signal g, which places switch 55 in a ready state for outputting contact detecting signal e.

At step ST17, capillary tool 42 lowers at a low speed of V2. The speed of V2 is low enough not to damage a chip even if the ball 41a on the tip of wire hits the chip.

Then at step ST18, time T3, contact between the ball 41a and the bonding face of the chip is detected.

Figure 12A:
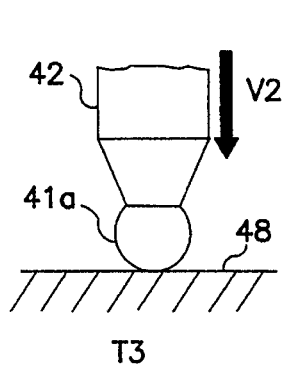
FIGS. 12a–12c show the different states of the ball on the tip of wire at times T3, T4, and T5 shown in FIG. 11.
Figure 12B:
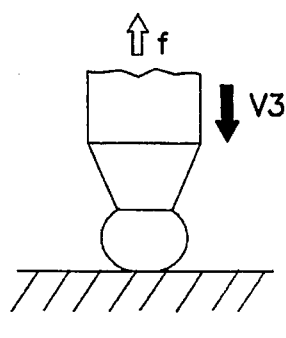

FIG. 12 (a) illustrates the ball 41a at time T3.

Then, at time T4, contact detecting signal e is outputted.

FIG. 12 (b) shows ball 41a at time T4. Between times T3 and T4, the capillary tool 42 lowers at the speed of V3 deforming the ball 41a. Then, at step ST19, and time T4, residual pulses are cleared and at step ST20, time T4, the positioning command signal h is halted.

After time T4, lowering of the capillary tool 42 is restrained.

Figure 12C:
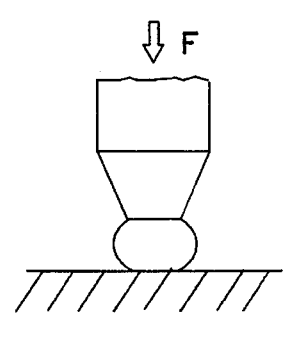

At step ST21, time T5, the control method for controlling the lowering of the capillary tool 42 is changed to the torque control method. FIG. 12(c) shows the ball 41a at time T5.

At step ST22, the torque command signal 1 is outputted and the ball 41a is pushed against the bonding face of the chip by the force of the motor torque.

Then, at step ST23, the ultrasonic oscillating signal q is outputted and an ultrasonic vibration is applied to ball 41a and ball 41a is bonded to the bonding face of the chip.

As mentioned above, the residual pulses are cleared at step ST19. As a result, lowering of capillary tool 42 is restrained, and the inertial force of moving portion of the capillary tool is reduced to almost zero. At step ST22, the ball 41a is pushed against the bonding face of chip by the sum of the forces of the motor torque and the inertial force of the moving portion of the capillary. As mentioned above, however, the inertial force has been already reduced to almost zero, and only a proper bonding force derived from the motor torque is applied to ball 41a. The excessive bonding load derived from the inertial force of moving portion is not applied to ball 41a.

Steps ST24 through ST30 are explained with reference to FIG. 13 and are grouped together as bonding step B. Bonding step B is selected for the second and subsequent bondings.

First, at step ST24, bonding step B is selected because the second or subsequent bonding is to be performed. The capillary tool 42 lowers at a high speed to control-switch-level L2 from its initial position 0.

Then, at step ST25, time T2, capillary tool 42 reaches the control-switch level L2.

At step ST26, time T2, the residual pulses are cleared.

At step ST27, time T2, positioning command signal h is halted, and lowering of capillary tool 42 is restrained.

At step ST28, time T3, the control method for controlling the lowering of the capillary tool is changed to the torque control method.

Then, at step ST29, the torque command signal 1 is outputted to the driving circuit 59a.

At step ST30, ultrasonic oscillating signal q is outputted after a specified time from time T3 and an ultrasonic vibration is applied to ball 41a, and ball 41a is bonded to the bonding face of chip.

Figure 13:
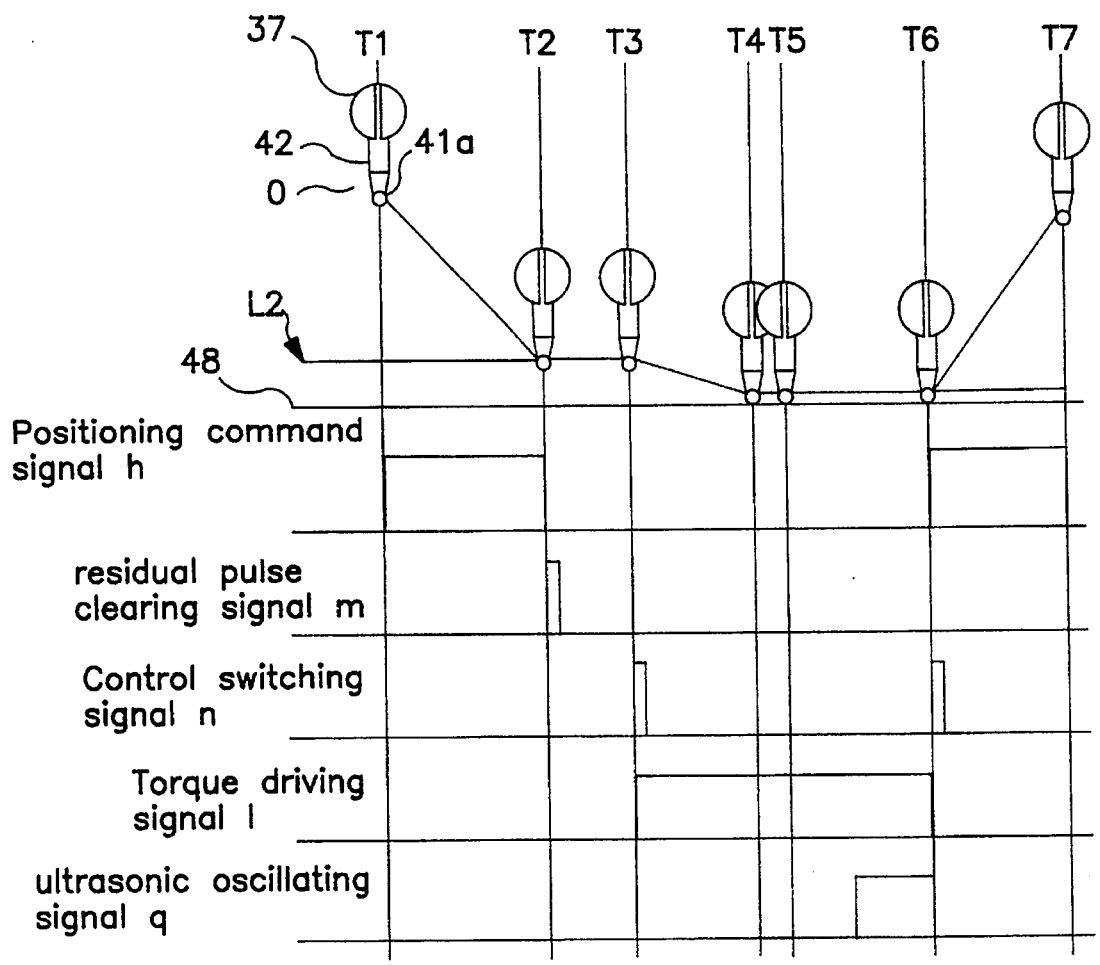
FIG. 13 is a timing diagram illustrating the bonding of a second wire to the chip.
Figure 16:
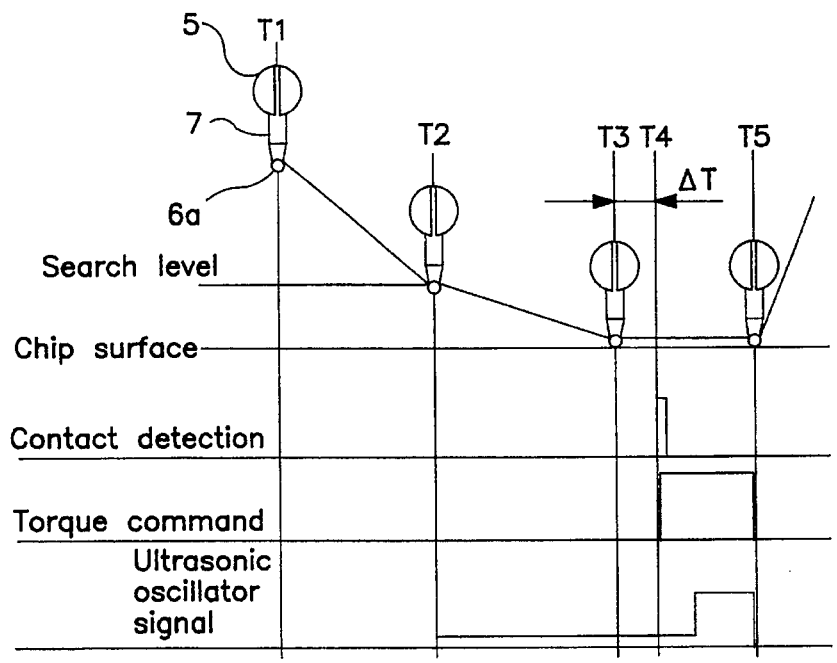
FIG. 16 is a timing diagram of the conventional wire bonding apparatus.
Figure 17:
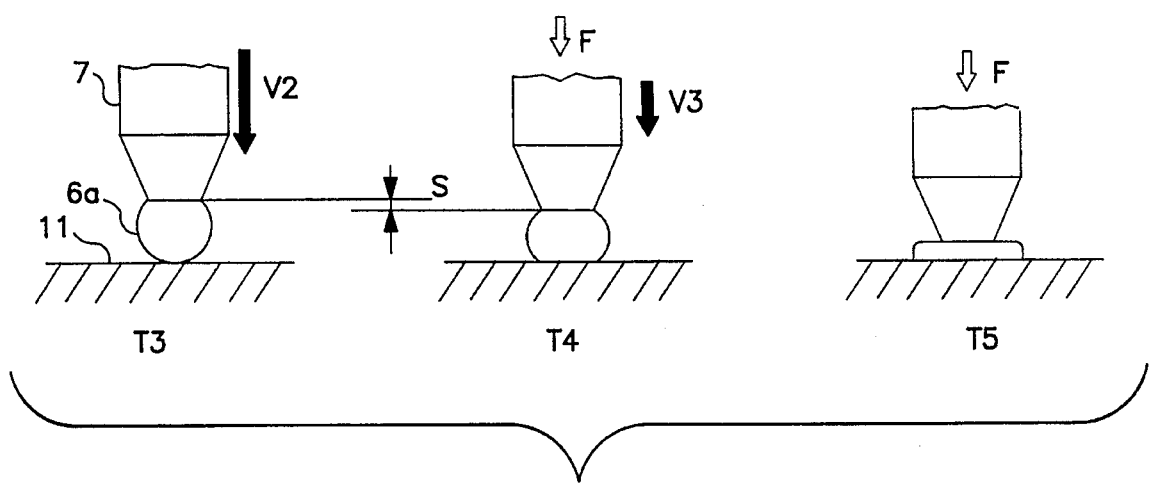
FIG. 17 illustrates the different states of the ball on the tip of the wire at times T3, T4, and T5 shown in FIG. 16.

FIGS. 14 (a), (b), and (c) show the different states of the capillary tool 42 at times T2, T3 and T4 in FIG. 13. At time T2, the capillary tool 42 reaches the control-switch-level L2 at the speed of V1. By clearing the residual pulses, the bonding controller 56 generates torque in the electric motor 40 to restrain the lowering of the capillary tool 42. The lowering speed of the capillary tool 42 is reduced to almost zero at the time T3, and the inertial force of the moving portion of the capillary tool is reduced to almost zero. Then the control method is changed to the torque control method at time T3. The capillary tool 42 continues to lower until time T4 where the ball 41a on the tip of wire contacts with the chip bonding face. The ball 41a pushes against the chip bonding face of the chip with the proper bonding load F derived from the torque the electric motor 40 generated by the torque control. As a result, bonding is completed. As mentioned above, since the inertial force of the moving portion is reduced to almost zero by restraining the lowering of the capillary tool, excessive bonding load is not applied to either ball 41a or the chip bonding portion.

The exemplary bonding step B is compared with the conventional bonding method below.

First, in bonding step B, the capillary tool lowers at a high speed to the control-switch-level L2 from its initial position. In contrast, the conventional apparatus has a capillary tool which lowers at a high speed to the search level L1 from its initial position, and then continues lowering at a lower speed. Since the search level L1 is higher above the bonding surface than the switch-control-level L2, the bonding step B is performed at a higher speed than the conventional art.

Second, in bonding step B, the control method is changed to the torque control method just before ball 41a contacts the chip bonding face. Therefore, the proper bonding load F is applied to ball 41a when the ball 41a contacts the chip bonding face. In contrast, for the conventional apparatus, the control method is changed to the torque control after detecting the contact. As a result, a period of time elapses before the proper bonding load F is applied to ball 41a. Accordingly, bonding step B is performed at a higher speed than the conventional art.

As mentioned above, bonding step B can be performed at a higher speed than the conventional art, and as a result a shorter cycle time also can be achieved.

Figure 9:
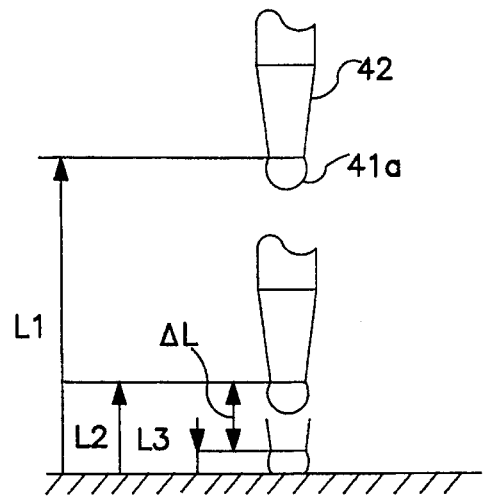
FIG. 9 illustrates the relationship between the height of capillary tool and the bonding operation.

The steps after step ST30 are common both for the bonding step A and bonding step B as illustrated in FIG. 13 and FIG. 9.

At step ST31, time T6, the height L3 of the bonding face of the chip, FIG. 9, is identified. Based on height L3, the height of the control-switch-level L2 for the next bonding to be performed is determined. The value of L2 stored in RAM 58 is updated with the newly determined value.

Then, at step ST32, the control method is changed to the positioning control method from the torque control method.

At step ST33, the capillary tool 42 returns to the initial position at a high speed.

The control-switch-level L2 on the above ST31 is updated in each bonding performance based on actual data. Therefore, even if a chip is positioned on a angle, the control-switch-level L2 can be properly set.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A wire bonding method which bonds a wire supplied by a capillary tool supported by a bonding arm to a bonding face of one of (a) a substrate and (b) a semiconductor chip using a bonding force derived from a driving means for driving the bonding arm, said wire bonding method comprising the steps of:

(a) lowering the capillary tool supplying the wire using the driving means controlled by a positioning control, (b) reducing a lowering speed of the capillary tool almost to zero before the wire contacts the bonding face, (c) changing the positioning control to a torque control, (d) instructing the driving means to generate a specified bonding force before the wire contacts the bonding face, (e) pushing the bonding face with the specified force when the wire contacts the bonding face, and (f) wire bonding the wire to the bonding face.

2. A wire bonding method which bonds a wire supplied by a capillary tool supported by a bonding arm to a bonding face of one of (a) a substrate and (b) a semiconductor chip with a bonding force derived from a driving means for driving the bonding arm, said wiring bonding method comprising the steps of:

(a) detecting the height of the capillary tool as a height of the bonding face after the wire has been bonded to the bonding face, (b) storing the height of the bonding face detected in step (a) and using the height of the bonding face to determine a restraining position to restrain the lowering of the capillary tool in the next wire bonding of a next wire to the bonding face, (c) lowering the capillary tool supplying the wire to perform the next wire bonding to the bonding face using the driving means controlled by a positioning control, (d) restraining the lowering of said capillary tool when said capillary tool reaches said restraining position, (e) changing the positioning control to a torque control, (f) instructing the driving means to generate a specified bonding force before the wire contacts the bonding face, (g) pushing the wire against the bonding face with the specified force after the wire contacts the bonding face, and (h) wire bonding the wire to the bonding face.

3. A wire bonding method which bonds a wire supplied by a capillary tool supported by a bonding arm to a bonding face of one of (a) a substrate and (b) a semiconductor chip using a bonding load derived from a driving means for driving the bonding arm, said wire bonding method comprising the steps of:

bonding a first wire to the bonding face using a first wire bonding method comprising the steps of:

(a) lowering the capillary tool supplying the first wire using the driving means controlled by a positioning control, (b) detecting a contact between the first wire and the bonding face, (c) restraining the lowering of the capillary tool, (d) changing from the position control to a torque control, (e) instructing the driving means to generate a specified bonding force, and (f) wire bonding the first wire to the bonding surface, bonding a subsequent wire to the bonding face using a subsequent wire bonding method comprising the steps of:

(g) detecting the height of the capillary tool as a height of the bonding face after a previous wire has been bonded to the bonding face, (h) storing the height of the bonding face detected in step (g) and using the height of the bonding face to determine a restraining position to restrain the lowering of the capillary tool in the subsequent wire bonding, (i) lowering the capillary tool supplying the subsequent wire to the bonding face using the driving means controlled by the positioning control, (j) restraining the lowering of the capillary tool when said capillary tool reaches said restraining position, (k) changing the positioning control to the torque control, (l) instructing the driving means to generate a specified bonding force before the subsequent wire contacts the bonding face, (m) pushing the wire against the bonding face with the specified force after the subsequent wire contacts the bonding face, and (n) wire bonding the subsequent wire to the bonding face.

4. A wire bonding method which bonds a wire supplied by a capillary tool supported by a bonding arm to a bonding face of one of (a) a substrate and (b) a semiconductor chip using a bonding force derived from a driving means for driving the bonding arm, said wire bonding method comprising the following steps in the order named:

(a) lowering the capillary tool supplying the wire by a constant low speed after passing a predetermined restraining position, (b) reducing a lowering speed of the capillary tool almost to zero before the wire contacts the bonding face by applying a force derived from the driving means in an opposing direction to the lowering of the capillary tool, (c) lowering the capillary tool by torque control until the wire contacts the bonding face after the lowering speed of the capillary tool is reduced almost to zero, and (d) wire bonding the wire to the bonding face.

5. The wire bonding method of claim 1, wherein the lowering speed of the capillary tool is reduced by applying torque in a direction to raise the capillary tool using the driving means.

* * * * *

UNITED STATES PATENT AND TRADE MARK OFFICE
CERTIFICATE OF CORRECTION

PATENT NO.   : 5,586,713
DATED        : December 24, 1996
INVENTOR(S)  : Arita et al.

It is certified that error appears in the above-identified patent and that said Letters Patent is hereby corrected as shown below:

Column 10, line 51, delete "1" and insert --4--.

Signed and Sealed this

Eighth Day of July, 1997

Attest:

BRUCE LEHMAN

Attesting Officer

Commissioner of Patents and Trademarks